United States Patent [19]

Bok

[11] Patent Number: 4,576,109

[45] Date of Patent: Mar. 18, 1986

[54] APPARATUS FOR APPLYING A COATING ON A SUBSTRATE

[76] Inventor: Edward Bok, Burg. Amersfoordtlaan 82, 1171 DR Badhoevedorp, Netherlands

[21] Appl. No.: 736,739

[22] Filed: May 22, 1985

Related U.S. Application Data

[62] Division of Ser. No. 551,992, filed as PCT NL83/00006 on Mar. 7, 1983, published as WO 83/02910 on Sep. 1, 1983, § 102(e) date Oct. 24, 1983, Pat. No. 4,560,590.

[51] Int. Cl.$^4$ .................. C23C 14/00; C23C 16/00
[52] U.S. Cl. .................................. 118/50; 118/62; 118/718; 118/719; 427/294; 427/434.3; 427/434.5
[58] Field of Search ............ 427/294, 434.3, 434.5; 118/50, 62, 718, 719

[56] References Cited

U.S. PATENT DOCUMENTS 4,387,123  6/1983  Wollam et al. .................. 427/358 X

FOREIGN PATENT DOCUMENTS 56704  7/1982  European Pat. Off. .

Primary Examiner—Michael R. Lusignan
Attorney, Agent, or Firm—David H. Semmes; Warren E. Olsen

[57] ABSTRACT

Apparatus for applying a coating, particularly for coating and advancing a substrate within a longitudinal passage having a plurality of transversely arrayed gaseous medium supply channels and a plurality of vacuum discharge channels intersecting the passage. A plurality of transversely arrayed coating medium supply channels intersect a processing side of the passage adjacent the vacuum discharge channels. Also, a restriction gap is defined in the passage intermediate the coating material supply channels and the vacuum discharge channels so as to insure filling of a first coating passage with coating material.

22 Claims, 14 Drawing Figures

APPARATUS FOR APPLYING A COATING ON A SUBSTRATE

This is a divisional of co-pending application Ser. No. 551,992 filed on Oct. 24, 1983, now U.S. Pat. No. 4,560,590 issued Dec. 24, 1985.

The invention relates to a method and apparatus to apply a coating on a flat surface.

Thereby use is made of a sub-micron filtered gaseous environment for the surface during the applying thereon of this coating.

The substrates or tape, in that way provided with a coating, can be used in the micro-electronica.

In the Dutch Patent Application No. 8 103 979 of the applicant a processing system is described, in which substrates are fed through a passage of a cabin and whereby by means of media a "floating" processing of these substrates is established.

Thereby in a coating station the applying of coating on the substrate takes place, whereupon by means of whirling flows of gases excessive coating is removed.

The disadvantages of this system are the following:

1. Thin fluid coating has to be applied as a very small thickness of the applied coating layer, which is left behind on the substrate. In that way successively applying of a great number coating layers is a requirement; and 2. Due to the forces of the whirling media, acting on the applied coating layer, the surface thereof is not smooth.

The apparatus for coating application according to the invention, whereby use is made of this "floating" processing of the substrates or tapes in the cabin passage, now is characterized by having means, included therein, to enable that after the passing of the coating application section the surface of such substrates or tape is free of excessive coating.

A following positive characteristic of the apparatus is, that as seen in the direction of movement of the substrate or tape, immediately behind the coating application channel a segment wall section is included therein, which for at least part thereof is at least near parallel to the substrate or tape, as a first coating passage.

Also, that thereby before the coating supply channel a segmentwall section is included therein, which for at least part thereof is at least near parallel to the substrate or tape, as a second coating passage, and under the influence of the media in the passage, acting on the substrate or tape, in this second coating passage such a coating lock is created and maintained, that coating is prevented from displacement therein with a higher speed than that of the substrate in the direction of substrate movement.

The first coating passage can also be constructed in that way, such that therein a coating lock is created and maintained, which prevents the leakage of coating in a direction, which is opposite to the direction of movement of the substrates or tape.

Consequently, by metering the volume of the supplied coating per second in combination with both coating locks a desired thickness of the applied coating can be obtained.

Such a metered coating supply apparatus can in particular be used with square substrates and tapes.

With substrates, not completely filling the total cabin passage, such as in the case of most circular substrates (wafers), inevitably at least periodically a leakage of coating occurs.

In view of this, another positive structure of the apparatus according to the invention is, that immediately behind the coating application channel a vacuumized discharge channel is located. Such a discharge channel can also function for the discharge of excessive coating.

Furthermore, as seen in the direction of movement of the substrate, the flow resistance of the coating passage defined between the coating supply channel and such a vacuum channel, positioned behind it, is considerably smaller than that of the coating passage between the coating supply channel and the supply channel in front of it, which functions for the urging of additional media towards the substrate.

Furthermore, coating, applied in the second coating passage, functions as a coating lock for excessive coating. This coating is displaced together with the substrate, as the first coating passage coating is urged towards the vacuum channel. In combination with the metered supply of coating per second, the passage width of both passages is predetermined and consequently the thickness of the coating layer, applied on the substrate.

A following very positive characteristic of the apparatus is, that within a segment separate branched channels for the supply of coating are positioned aside each other. These channels are on one end thereof connected with a common supply channel and on the other end thereof connected with at least one mouth, whereby in each of such branched channels the same flow restriction is incorporated, being such, that the total restriction thereof is at least as large as the flow restriction of the first coating passage.

Furthermore, the setting of the height of at least the medium cushions behind the coating supply section is such, that in case of no supply of coating, the substrate makes a mechanical contact with these coating passage-walls. The coating, supplied under pressure, then establishes a coating gap against the reaction force of the substrate and the thrusts of the media.

Each local narrowing of the passage width of the coating passage immediately establishes in that area an increased and correcting thrust of the coating supply and the same occurs oppositely. As a result, over the whole width of the substrate the gap width and consequently the thickness of the applied coating layer remains practically the same.

Other characteristics of the coating apply system and apparatus follow from the description of the Figures, as described underneath.

Figure 1:
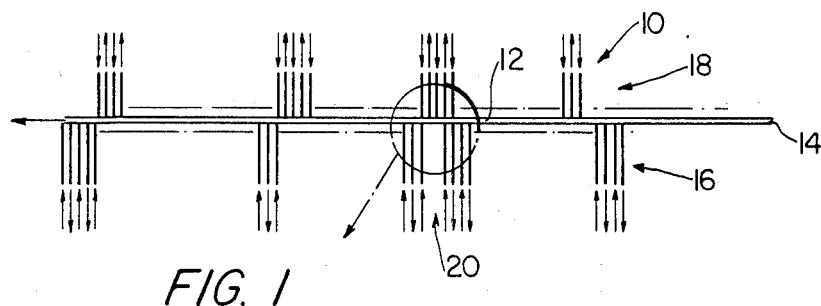
FIG. 1 is a vertical longitudinal sectional view of a cabin, in which the coating application apparatus according to the invention is incorporated.

In FIG. 1 a part of processing cabin 10 is shown, with in the central section thereof the passage 12 for substrates or tape 14. On both sides of this passage segments 16 and 18 are positioned.

Figure 2:
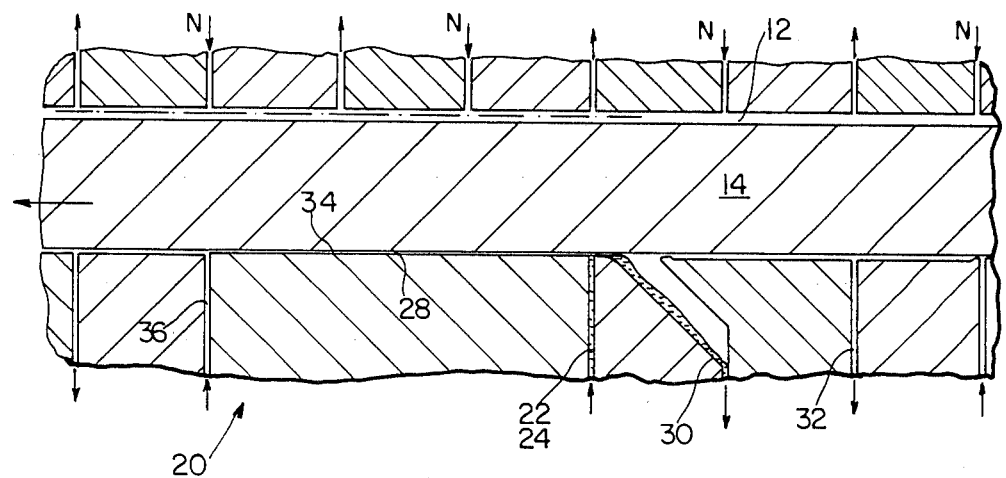
FIG. 2 shows the coating supply apparatus in an enlarged sectional view.

In this cabin the appliance application of coating takes place on the substrates, passing through and such in station 20, see also FIG. 2. Thereby through channel 22 coating 24 is urged towards coating passages 26 and 28, see also FIG. 3, and applied on the substrate. Such application of coating takes place after the vacumizing of the coating application section through high vacuum channel 30.

The length of first passage 26 is restricted, for instance only 30 micrometer, consequently, even with a small passage height of 0.5 micrometer, there is still a relatively low flow restriction thereof for the coating.

The length of second passage 28 however is in comparison very large, for instance 1 mm, causing the flow restriction therein for the coating to be so high, that therein a coating lock 34 is established and maintained, which lock is taken along with the substrate and is continuously supplemented with newly applied coating.

If via channel 22 an over amount of coating is supplied, the urging of excessive coating takes place via channel 26 towards the high vacuum channel 30.

Figure 4:
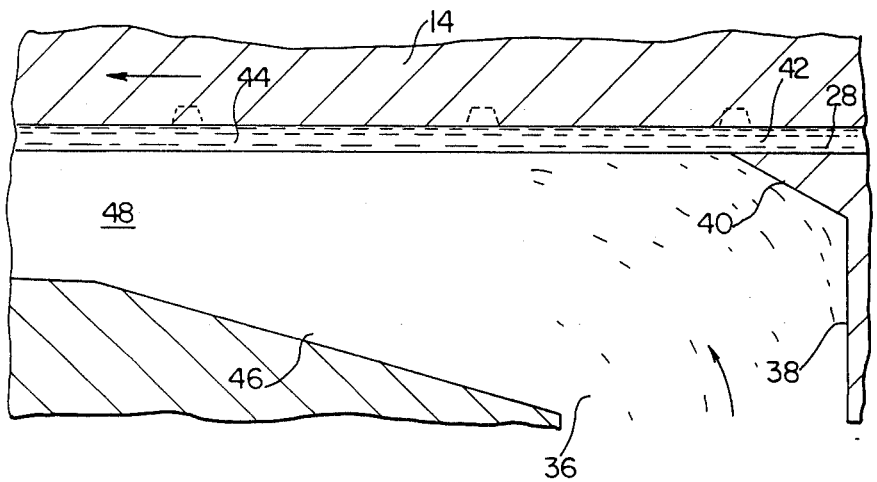
FIG. 4 is a greatly enlarged sectional view of the coating apparatus at the outlet of the supply channel of gaseous processing medium, in front of the coating supply channel.

Through channel 36, see also FIG. 4, gaseous medium is supplied. The coating, which, adhering to the substrate, leaves the second passage 28, cannot stick to the back side 38 of the coating segment, because of:

1. the over pressure of the gaseous medium, as present in channel 36;
2. a relatively very high speed of the substrate with the applied coating, in comparance with the thickness of the coating layer;
3. a high viscosity of the coating; and
4. the sharply edged profile of the top section 40 of this back side 38.

If required, through channel 36 also thinner, whether or not in vapor phase, can be urged to move along the segment wall 38 towards the coating layer and so helps to prevent an adhering of coating to the coating segment.

The passage wall 42 of the coating segment is ultra polished, with a roughness, which preferably is smaller than 0.1 micrometer. Consequently, the coating layer 44, as it is free, is extremely smooth and so almost instantly an oven drying of this applied coating layer can take place.

The passage wall 46 of the following segment is situated a relatively great distance from the substrate 14, with the creation of the passage 48, having a relatively great height. Consequently, a contact of this wall 46 with the coating layer 44, applied on the substrate, is prevented. Since the narrow discharge channel for the media, passing through the passage, 48 is extremely small, such media cannot negatively effect the coating 44.

Figure 5:
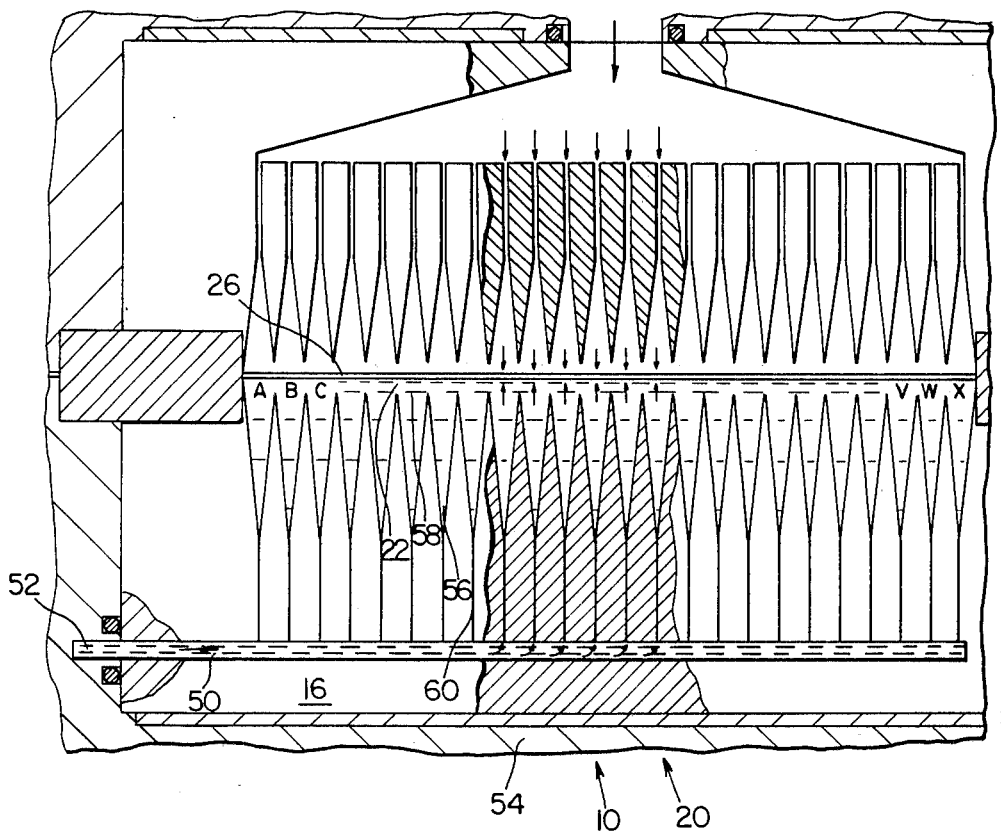
FIG. 5 is a cross-sectional view of the cabin at a segment, in which the parallel positioned branched channels for the supply of coating are situated.

In FIG. 5 the cabin 10 is shown in a cross-section of the coating supply section 20. The main coating channel 50, located in segment 16, is connected with the supply channel 52, which is positioned in the sidewall 54 of the cabin. A great number of branched channels 56 are in open connection with this channel 50.

Furthermore, these channels 56 are by means of their outlets 58 connected with an extremely small coating supply channel 22, of which the sections A through X correspond with those of passage 26. Thereby the communication of the channel sections is kept very restricted.

In the branched channels the channel sections 60 are located. The passage dimensions thereof are extremely small, for instance 30 micrometer times 30 micrometer, whereas also the length of these sections is relatively very large. Consequently, the flow restriction of such a channel section 60 is very large and considerably larger than that of each of the passage sections 26A through 26X.

Consequently, via each passage section 26A through 26X approximately the same amount of coating is urged towards the main vacuum channel 32, whereby every local smallest reduction in height instantly results in an increase in urging pressure in the corresponding channel sections 22A through 22X to still urge the volume of coating through these passage sections.

Figure 3:
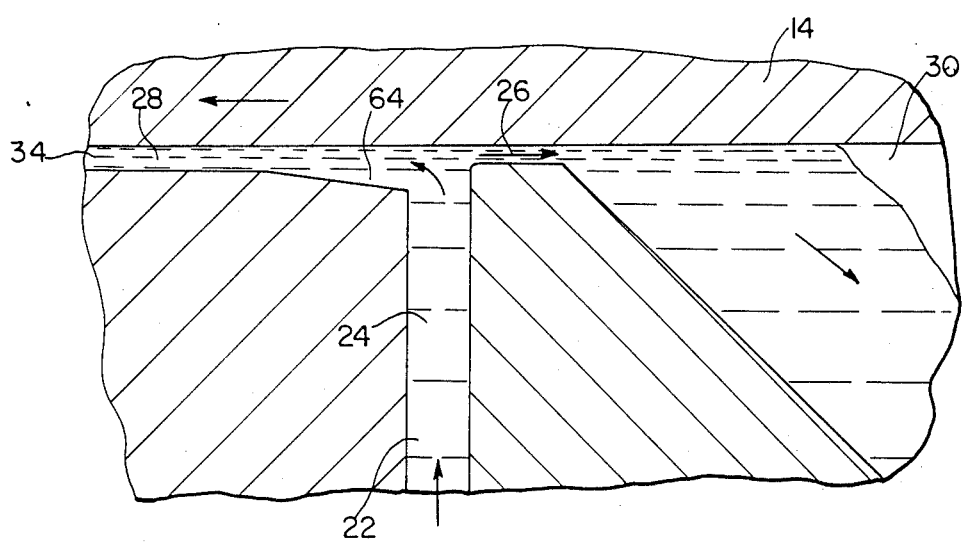
FIG. 3 shows in a greatly enlarged sectional view the outlet of the coating supply channel into the cabin passage.

This increase in urging pressure also increases the urging pressure in the entrance 64 of second passage 28, see also FIG. 3.

The resultant increased force on the substrate in upward direction overcomes the increase in forces, which locally have urged the substrate in a downward direction.

Oppositely, each local increase in height of a passage section immediately results in a decrease in urging pressure in a corresponding channel section 22A through 22X and a resulting decreased force on the corresponding section of the substrate in upward direction.

In that way a stabilisation of forces on the substrate takes place with almost the same height of each section A through X of the coating passages 26 and 28 and consequently a practically constant thickness of the applied coating layer.

Figure 9:
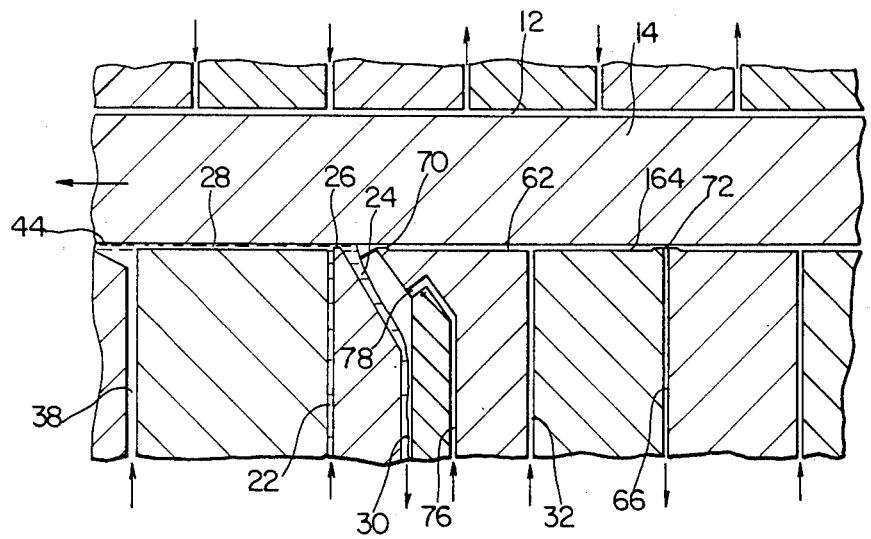
FIG. 9 shows in a longitudinal sectional view a coating application apparatus, whereby a channel for the supply of coating thinner debouches into the high vacuum channel.
Figure 10:
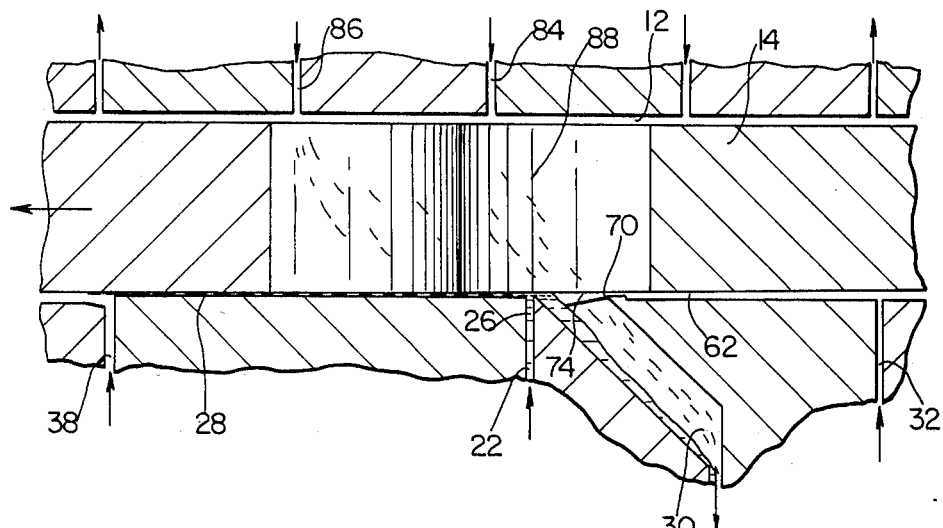
FIG. 10 is a longitudinal sectional view of a coating application apparatus, in which a high temperature is maintained and whereby by means of a supply of evaporated thinner the drying of the coating, which is applied on the substrate, and gatherings of coating in the passage are prevented.

In FIG. 2 behind vacuum channel 30 the supply channel 32 for gaseous and/or vaporized medium is located, see also FIGS. 9 and 10. Thereby this medium is urged towards the high vacuum channel 30 and through passage 164 towards the high vacuum channel 66, positioned behind it.

Near the high vacuum channel 30 the passage 62 has been narrowed. Thereby this passage section 70 is extremely small, as for instance 0.3 micrometer. Because the length of it, as seen in longitudinal direction of the passage way, is also very limited, for instance 20 micrometer, the flow restriction in this passage section is not large.

The supply channel 32 has the same configuration of a great number of branched channels as is shown in FIG. 5, causing the flow restriction therethrough to be considerably greater than that of the corresponding sections of this passage section 70. In that way the volume of medium, per second urged through the supply channel 32, is almost independent of the local presence of a substrate section, as is shown in FIG. 10, with the passing through of almost circular substrates.

By keeping low the volume of media, urged to flow through this narrow passage 70 per second, the small passage height of 0.3 micrometer becomes possible.

Fluctuations in the pressure of the media in the cabin passage might change this height to a small extent. However, already with a reduction in height of 0.1 micrometer, the pressure thrusts in the medium passages 62 and 70 sharply increase. In that way by means of the resulting local increased forces on the substrate a levelling action is obtained.

As a result, by extending this combination of passages 62 and 70 towards very close to the coating supply channel, 32 and such to for instance 0.1 mm distance, a guidewall for the substrate 14 is obtained, which at least in combination or even possibly alone, can establish and maintain the height of the coating passages 26 and 28, as wanted.

Due to this feature, also the thickness of the coating 44, applied on the substrate 14, differs with these small values.

In passage 164 also near the high vacuum channel 66 a passage narrowing 72 is positioned, whereby during processing almost the same 0.3 micrometer gap height as with passage 70 can be valid. As a result, as seen in longitudinal direction of the cabin passage and substrate movement, behind the coating supply section a guide area for the substrates has been created, which even with extremely thin substrates, having a thickness of only 0.15 mm, ensures an even thickness of the applied coating layer.

Due to the extremely small gap height of the passage section 70, the discharge of medium towards the discharge channel 30 is very small and amounts for instance only approximately 20 mm$^3$ per second for a substrate with a diameter of 125 mm.

By also keeping the quantity of superfluous coating restricted and which through first coating passage 26 flows towards this discharge channel 30 in the amount of only for instance 10 mm$^3$ per second, a too large gathering of coating and medium in the vacuum channel 30 is prevented and so by means of this channel 30 a vacuum near the substrate surface 74, see FIG. 10, can successfully be established and such before this surface is covered with the coating.

Furthermore, due to the relatively low flow restriction of passages 26, 70 and 72 the processing pressure in and around the coating application section can remain low with the following advantages:

1. a small and allowable wear-down of these passage walls;
2. the average pressure in the rest of the cabin passage can remain low; and
3. due to the low processing pressure of the gaseous medium in the drying/oven section the influence of this medium on the coating layer is negligible, with no negative effect on the applied coating layer.

Very thick coating can now be urged towards the substrate and whereby the superfluous coating, discharged through passage 26, can be thinned in the vacuum channel 30 by means of the thinner 78, supplied through channel 76, see FIG. 9.

Also, at least the coating section of the cabin can be maintained at a high temperature, up to for instance 80° C. Such to enable the percentage of solids in the applied coating to be as high as possible.

Figure 11A:
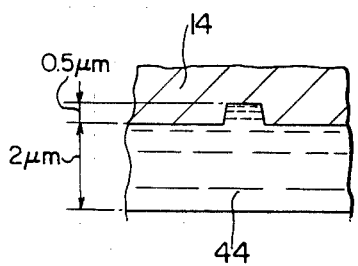
FIG. 11A shows a substrate section with a stepped surface and on which a layer of fluid coating has been applied.
Figure 11B:
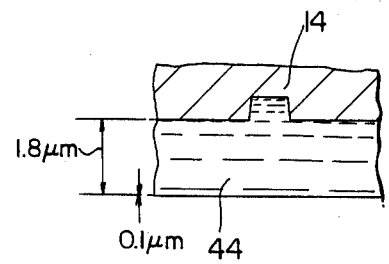
FIG. 11B shows the substrate section according to FIG. 11A after oven drying thereof.

The high percentage of solids enables an ideal supply of a planarisation layer of coating on a stepped surface of the substrate 14, see FIG. 11A, whereby such planarisation after oven drying is still unchanged with a nearly complete diminishing of the steps, see FIG. 11B.

Figure 12A:
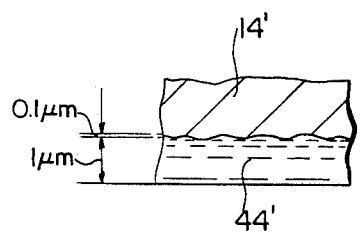
FIG. 12A shows a polished substrate section with a coating, applied thereon.
Figure 12B:
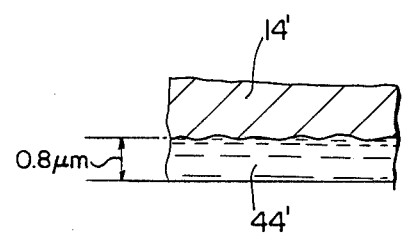
FIG. 12B shows the section according to FIG. 12A after oven drying thereof.

Furthermore, after the oven drying the thickness of the coating 44', applied on a polished surface of the substrate 14', can still have approximately the same height, with a completely smooth top of the coating, as is shown in FIGS. 12A and 12B.

In that way a perfect system for the applying of coatings on substrates is obtained, which cannot be met by any of the existing coating installations.

Figure 6:
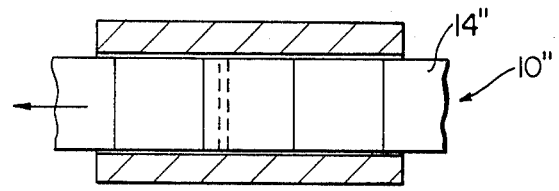
FIG. 6 is a cabin section, wherein square substrates are passing through its passage.
Figure 7:
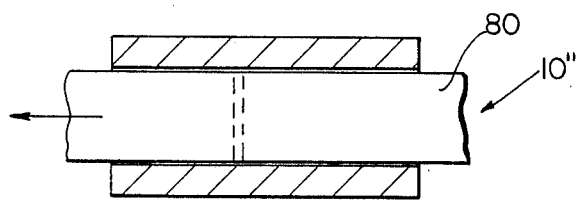
FIG. 7 is the cabin section according to FIG. 6, wherein a tape is fed through the passage.
Figure 8:
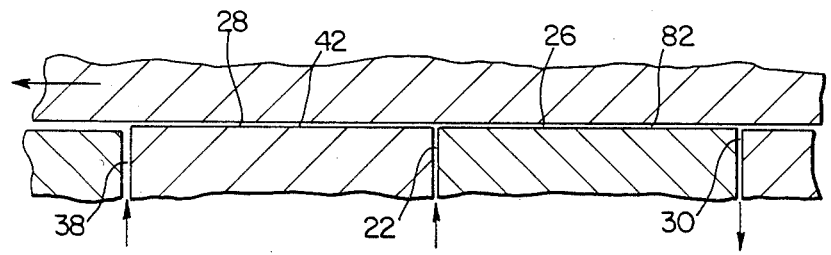
FIG. 8 is a longitudinal sectional view of a coating application section, which is applicable in the cabin according to FIGS. 6 or 7.

With the processing of square substrates 14" or tape 80, see FIGS. 6 and 7, such a periodic discharge of coating is not required. Thereby the structure according to FIG. 8 is possible, whereby in both passage 26 and passage 28 the respective coating locks 42 and 82 are established with no escape of superfluous coating from passage 26 to the high vacuum channel 30.

In that case other safeguards can be part of the system to prevent coating to contaminate the cabin passage.

A number of media channels 84 and 86, supplying the media cushions above the substrates, can also supply at least thinner 88 for the coating in whether or not vapor phase, see FIG. 10. Thereby with almost circular substrates 14 such a media are periodically urged into the open passage sections and move towards channel 30 under the taking along with them of the coating, urged from channel 22. In that way a gathering of coating in the passage 12 is prevented.

Furthermore, during the under high temperature applying of coating on the substrates, the medium supplied through channel 32 can be a medium in vapor phase to prevent a sealing off of the high vacuum channel 30.

Within the scope of the invention variations in the shown configurations of channels, process pressures,—temperatures and heights of the passages are possible.

Furthermore, the apparatus embodies all installation components, as required for the correct supply and discharge of the media, whereby sensors can be installed in the supply channels of the various processing media to command regulating systems.

I claim:

1. Apparatus for applying a coating upon an advancing substrate comprising:
   a. a housing;
   b. a longitudinal coating passage defined within said housing by a plurality of pairs of superposed segment blocks;
   c. a plurality of transversely arrayed gaseous medium supply channels communicant with a pressurized gaseous medium supply, and defined within said segment blocks so as to intersect the top and bottom of said passage and advance the substrate through said passage;

d. a plurality of vacuum discharge channels defined within said segment blocks, so as to intersect said passage;

e. a plurality of transversely arrayed coating medium supply channels communicant with a coating medium supply and defined within segment blocks so as to intersect said intersecting at a processing side of said passageway, adjacent said vacuum discharge channels; and f. a first restriction gap defined in said passage intermediate said coating material supply channels and said vacuum discharge channels, so as to ensure filling of a first coating passage with coating material.

2. Apparatus for applying a coating upon an advancing substrate as in claim 1, said first coating passage including a second restriction gap defined as a coating lock for a second coating passage beyond said coating medium supply channels.

3. Apparatus for applying a coating upon an advancing substrate as in claim 2, said second restriction gap in said second coating passage being dimensioned so as to at least almost prevent coating material escaping therefrom to flow in a direction oppositely to the movement of the advancing substrate.

4. Apparatus for applying a coating upon an advancing substrate as in claim 3, including a vacuum discharge channel being located beyond said coating medium supply channels, so as to discharge superfluous coating material from said second coating material.

5. Apparatus for applying a coating upon an advancing substrate as in claim 4, including medium supply channels being located immediately forward of said coating medium supply channels.

6. Apparatus for applying a coating upon an advancing substrate as in claim 5, the flow resistance of said first restriction gap being less than the flow resistance of said second restriction gap.

7. Apparatus for applying a coating upon an advancing substrate as in claim 5, wherein each of said transversely arrayed coating supply channels includes an individual branch communicating with said coating supply, each branch having a flow restriction mouth in open communication with said coating passage, such that the flow restriction of said coating supply channels is at least the same as the flow restriction of said second restriction gap.

8. Apparatus for applying a coating upon an advancing substrate as in claim 7, the combined flow restriction of said coating medium supply channels being at least five times greater than the flow restriction of said first restriction gap.

9. Apparatus for applying a coating upon an advancing substrate as in claim 8, the width of each said coating medium supply branch channel mouth being less than fifty micrometers.

10. Apparatus for applying a coating upon an advancing substrate as in claim 9, said first restriction gap being smaller than said second restriction gap.

11. Apparatus for applying a coating upon an advancing substrate as in claim 9, said first restriction gap being 0.5 micrometers smaller in height than said second restriction gap.

12. Apparatus for applying a coating upon an advancing substrate as in claim 11, the height of said first restriction gap being less than one micrometer.

13. Apparatus for applying a coating upon an advancing substrate as in claim 9, said second restriction gap being of greater height than said first restriction gap.

14. Apparatus for applying a coating upon an advancing substrate as in claim 5, wherein a plurality of transversely arrayed gaseous medium supply channels are located beyond a plurality of vacuum discharge channels, so as to maintain a media cushion underneath the advancing substrates on the processing side of both said longitudinal coating passages and said vacuum discharge channel cross-section is greater than the cross-section of said gaseous medium supply channels.

15. Apparatus for applying a coating upon an advancing substrate as in claim 14, including a first coating passage defined forward of said first restriction gap and a second coating passage defined beyond said second restriction gap.

16. Apparatus for applying a coating upon an advancing substrate as in claim 15, including heating means communicative with said first and second coating passages so as to maintain said coating medium and said coating passages at a temperature of 50° C. or greater.

17. Apparatus for applying a coating upon an advancing substrate as in claim 15, including a plurality of supply channels for medium, containing at least thinning agent in vapor phase, intersecting said passage immediately forward of said first coating passage.

18. Apparatus for applying a coating upon an advancing substrate as in claim 17, wherein the lower wall on the longitudinal passage on the processing side of said passage intermediate said coating means supply channels and vacuum discharge channels forward of said supply channels extends axially into said coating passage, further than the wall on the processing side beyond said coating medium supply channels.

19. Apparatus for applying a coating upon an advancing substrate as in claim 18, wherein said gaseous medium supply channels and said thinning agent supply channels are in the form of separate branch channels with a combined flow restriction greater than the flow restriction created by said coating passage walls and the moving substrates during processing.

20. Apparatus for applying a coating upon an advancing substrate as in claim 19, said vacuum discharge channels comprising a great number of separate branch channels with a high flow restriction.

21. Apparatus for applying a coating upon an advancing substrate as in claim 20, wherein the flow restriction in said vacuum discharge channels, is such that the velocity of gaseous medium being discharged from said coating passage into said vacuum discharge channels is not greater than 100 mm. per second.

22. Apparatus for applying a coating upon an advancing substrate as in claim 2, including a plurality of thinning agent supply channels intersecting said longitudinal coating passage on the non-processing side, in the vicinity of said coating medium supply channels in the processing side.

* * * * *